United States Patent [19]

Kato

[11] Patent Number: 4,899,076
[45] Date of Patent: Feb. 6, 1990

[54] PIEZOELECTRIC OSCILLATOR

[75] Inventor: Toshitake Kato, Tokyo, Japan

[73] Assignee: Citizen Watch Co., Ltd., Tokyo, Japan

[21] Appl. No.: 202,066

[22] Filed: Jun. 3, 1988

[30] Foreign Application Priority Data

Mar. 6, 1987 [JP] Japan .................................. 62-032796
Jun. 5, 1987 [JP] Japan .......................... 62-086638[U]

[51] Int. Cl.4 ........................................... H01L 41/08
[52] U.S. Cl. .................... 310/356; 310/355; 310/353; 310/344
[58] Field of Search ................ 310/348, 351, 353–356, 310/365, 346

[56] References Cited

U.S. PATENT DOCUMENTS

| | | | |
|---|---|---|---|
| 2,315,392 | 3/1943 | Bokovoy | 310/353 |
| 2,341,683 | 2/1944 | Bailey | 310/356 |
| 2,395,034 | 2/1946 | Bokovoy | 310/356 |
| 2,486,482 | 11/1949 | Brie | 310/355 X |
| 2,488,781 | 11/1949 | Reeves | 310/355 X |
| 3,619,672 | 11/1971 | Nagata | 310/355 X |
| 3,805,348 | 4/1974 | Nagata | 310/355 X |
| 3,931,388 | 1/1976 | Hafner et al. | 310/353 |
| 4,145,627 | 3/1979 | Ishizawa | 310/353 X |
| 4,485,325 | 11/1984 | Yamamoto et al. | 310/356 X |
| 4,542,315 | 9/1985 | Yamamoto et al. | 310/356 X |

Primary Examiner—Mark O. Budd
Attorney, Agent, or Firm—Finnegan, Henderson, Farabow, Garrett & Dunner

[57] ABSTRACT

A tubular piezoelectric oscillator having an electroconductive or non-electroconductive tubular casing, the vacuum interior chamber of which receives piezoelectric oscillating element rectangular plate supported at at least one end thereof by an elastic support element for protecting the piezoelectric oscillating element from thermal deformation and impulsive or vibratory force transmitted from the outside. The interior chamber of the tubular casing is maintained in a vacuum condition by a hermetically sealed pipe-like sealing member or members provided at either one or both axially opposite ends of the tubular casing, at which ends are arranged electroconductive members used as electric leads for extracting an electric oscillating signal from the piezoelectric oscillating element.

11 Claims, 9 Drawing Sheets

PIEZOELECTRIC OSCILLATOR

BACKGROUND OF THE INVENTION

1. Field of the Invention

The present invention relates to a piezoelectric oscillator, more particularly, it relates to a tubular piezoelectric oscillator of the type wherein a piezoelectric oscillating element, such as a piece of quartz, is elastically supported by a torsionally displacing support element or elements within a tubular vacuum casing, and two electric leads are arranged at or adjacent to the opposite ends of the tubular casing.

2. Description of the Related Art

A conventional small piezoelectric oscillator, such as a quartz oscillator, is in the shape of a hermetically sealed tubular electric element having two parallel electric leads extending from one end of the element. The conventional tubular piezoelectric oscillator contains therein a piezoelectric oscillating element supported at one end thereof in a cantilever construction, and therefore, the oscillator is easily broken if dropped. When the conventional piezoelectric oscillator is mounted on, e.g., a printed circuit board, the two electric leads of the oscillator must be bent at a right angle and inserted in the board, so that the hermetically sealed tubular body of the oscillator can be stably affixed to the surface of the printed circuit board by a suitable adhesive. Accordingly, the mounting of the conventional small piezoelectric oscillator on a printed circuit board or other diverse electric and electronic appliances is cumbersome and costly.

The above-mentioned disadvantage of the conventional small tubular piezoelectric oscillator can be eliminated by another conventional piezoelectric oscillator disclosed in, for example, Japanese Unexamined Patent Publication No. 58-219809 and Japanese Unexamined Utility Model Publication No. 55-13462. The latter conventional piezoelectric oscillator according to, e.g., Japanese Unexamined Patent Publication No. 58-219809, has a piezoelectric oscillating element, such as a piece of quartz, supported at both ends within a tubular casing consisting of a hermetically sealed glass tube. Namely, the ends of the piece of piezoelectric oscillating element are connected to solid electric leads, respectively, via a U-shaped support spring within the tubular casing. The electric leads extend respectively and sealingly outwardly from both ends of the tubular glass casing. But, due to the construction of the latter conventional piezoelectric oscillator, a different problem arises during the manufacture of the oscillator. Namely, in the case of a small piezoelectric oscillator, the piezoelectric oscillating element preferably must be held within the tubular casing under a vacuum condition, to maintain a good electric characteristic of the oscillating element, and therefore, during the production of the oscillator, air must be exhausted from the interior of the tubular glass casing and the ends of the casing must be hermetically sealed. When the air exhausting and hermetically sealing operations are carried out under a vacuum condition, care must be taken to prevent a generation of bubbles due to a gas emitted from the glass material, and therefore, the air exhausting and hermetic sealing operations are difficult and increase the cost of producing the piezoelectric oscillator. Moreover, the electric characteristic of the oscillating element held in the interior chamber of the tubular glass casing is not always stable. Accordingly, to acquire a stable electric characteristic of the oscillating element, an inert gas, such as $N_2$ gas and He gas, must be filled in the interior of the tubular casing of the piezoelectric oscillator, which makes it difficult to produce a high quality small piezoelectric oscillator having a small electric equivalent series resistance.

On the other hand, in the conventional piezoelectric oscillator of Japanese Unexamined Patent Publication No. 58-219809, a supporting structure for the piezoelectric oscillating element within the tubular casing of U-shaped spring is provided, to soften any impulsive or impact force due to shock and vibration applied to the piezoelectric oscillating element from outside the tubular casing, and to elastically absorb stress due to thermal expansion and contraction of the oscillating element, per se, and the tubular casing, which occur when the piezoelectric oscillator is used under an environmental condition such that a temperature surrounding the oscillator varies widely from a high to a low temperature, and vice versa. The softening and absorbing operations of the conventional supporting structure by the U-shaped spring rely on the bending motion of the spring, and thus does not fully realize the above-mentioned effect. As a result, often a required electric characteristic of a small tubular piezoelectric oscillator cannot be obtained. Accordingly, a provision of an improved means for supporting a piezoelectric oscillating element in a hermetically or airtightly sealed tubular casing is needed to enable the production of a small durable tubular piezoelectric oscillator which can be used regardless of a wide temperature change from high to low and under conditions where the oscillator may be exposed to external shock and vibration applied from outside the oscillator.

SUMMARY OF THE INVENTION

An object of the present invention is to provide a tubular piezoelectric oscillator having a piezoelectric oscillating element housed in a vacuum chamber of a hermetically or airtightly sealed tubular casing provided with an electric lead means on axially opposite sides of the tubular casing.

Another object of the present invention is to provide the tubular piezoelectric oscillator mentioned above having a stable and good electric characteristic, at a low production cost.

A further object of the present invention is to provide a tubular piezoelectric oscillator provided with a means for elastically supporting a piezoelectric oscillating element within a hermetically sealed tubular casing, whereby the oscillator can withstand not only mechanical shock and vibration transmitted in the longitudinal direction of the element but also a large change of temperature which causes a thermal expansion or contraction deformation of the piezoelectric oscillating element, per se, and of the tubular casing.

A still further object of the present invention is to provide a tubular piezoelectric oscillator capable of being easily and firmly mounted on a surface of a printed circuit board.

In accordance with the present invention, there is provided a piezoelectric oscillator which comprises:

a tubular casing defining therein an axial vacuum chamber extending between opposite ends of the tubular casing;

a piezoelectric oscillating element received within the axial vacuum chamber of the tubular casing; and, first and second mutually insulated electrically conductive means arranged at the opposite ends of the tubular casing for permitting an extraction of an electric oscillating signal from the piezoelectric oscillating element, at least the first conductive means comprising a first electric lead means, a first sealing means for hermetically sealing the tubular casing at one end thereof to thereby maintain the chamber of the tubular casing in a vacuum condition, and a first elastic support means for elastically supporting one end of the piece of piezoelectric element within the axial vacuum chamber of the tubular casing to thereby protect the piezoelectric oscillating element from thermal stress and impulsive forces, the second conductive means comprising at least a second electric lead means connected to the other end of the piece of piezoelectric oscillating element, and cooperating with the first electric lead means of the first conductive means to extract the electric oscillating signal.

BRIEF DESCRIPTION OF THE DRAWINGS

The above and other objects, features and advantages of the present invention will be made apparent from the ensuing description of the embodiments of the present invention with reference to the accompanying drawings, wherein.

DESCRIPTION OF THE PREFERRED EMBODIMENTS

Figure 1:
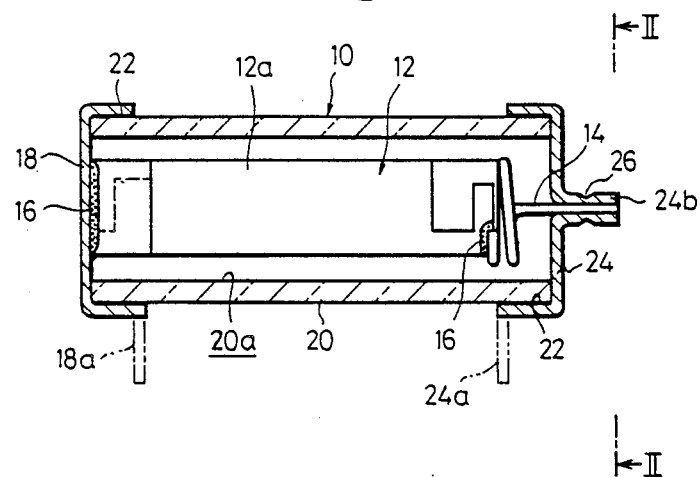
FIG. 1 is a longitudinal cross-sectional view of a tubular piezoelectric oscillator according to a first embodiment of the present invention.
Figure 2:
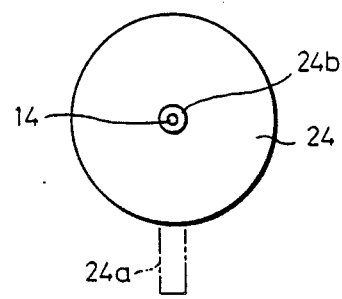
FIG. 2 is a side view of the oscillator taken along the line II—II of FIG. 1.

Referring to FIGS. 1 and 2, a piezoelectric oscillator according to a first embodiment of the present invention is generally designated by a reference numeral 10 and has a piezoelectric oscillating element 12 made of an AT cut rectangular piece of quartz. The surface of the oscillating element 12 is coated, by vacuum evaporation, with a membrane electrode 12a, i.e., a membrane of silver (Ag), gold (Au), or aluminum (Al). One end of the piezoelectric oscillating element 12 is connected to an elastic support member 14 made of a elastic and conductive material, such as kovar, an Ni-Fe system alloy, and phosphorous bronze by a conductive bonding means 16, e.g., a conductive adhesive, and by a solder or by brazing. The elastic support member 14 is electrically connected to the membrane electrode 12a. The other end of the piezoelectric oscillating element 12 is connected to a cap 18 made of an appropriate metallic material, by a similar bonding means 16 so that an electric connection is established between the oscillating element 12 and the metallic cap 18. The metallic cap 18 is formed from a thin metallic plate by drawing, and is fixed to an end of a hollow tubular casing 20, having a circular cross section in the case of the present embodiment as illustrated in FIG. 2. Note, the cross section of the tubular casing 20 may be oval, rectangular, or square as required.

The metallic cap 18 may be provided with a narrow projection 18a shown by a partly broken line in FIGS. 1 and 2 and extending radially from a part of the body of the cap 18. The tubular casing 20 in which the piezoelectric oscillating element 12 is received is made of an electric insulating and airtight material, such as a glass and a ceramic material in the case of the present first embodiment. A thin layer 22 of glass having a low melting point is applied between the metallic cap 18 and the end of the tubular casing 20 to provide a hermetic or airtight sealing therebetween.

Alternately, a hermetic or airtight sealing between the metallic cap 18 and the end of the tubular casing 20 may be provided by a combination of a conventional metallizing treatment initially applied to the tubular casing end and a soldering or brazing subsequently applied to the connection between the metallic cap 18 and the metallized end of the tubular casing 20.

Another metallic cap 24 having an approximately similar shape to that of the metallic cap 18 is fixed to the other end of the tubular casing 20 by the hermetic sealing method by using a similar thin sealing layer 22 of glass. The metallic cap 24 also may have a narrow radial projection 24a similar to the radial projection 18a of the metallic cap 18. These narrow metallic projections 18a and 24a may be used as electric leads when the piezoelectric oscillator 10 is mounted so as to be inserted into mounting holes of, e.g., a printed circuit board (not shown). The metallic cap 24 has a hollow tubular portion 24b axially extending from the central portion of a body of the cap 24, and an outer end of the afore-mentioned elastic support member 14 is inserted in the hollow tubular portion 24b. The hollow tubular portion 24b of the metallic cap 24 is constricted to an airtight condition at a portion 26 thereof by applying a mechanical pressure, and is hermetically sealed to establish a later-described vacuum condition within an interior chamber 20a of the tubular casing 20. A laser heating or a resistance welding may be additionally applied to the constricted portion 26 to ensure a complete hermetic or airtight sealing condition.

Figure 3A:
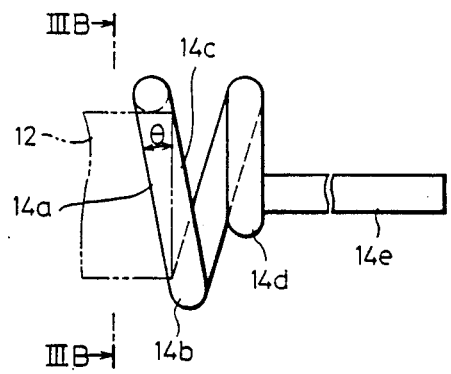
FIGS. 3A and 3B are partial enlarged front and side views of an elastic support member employed in the embodiment of FIG. 1, respectively.
Figure 3B:
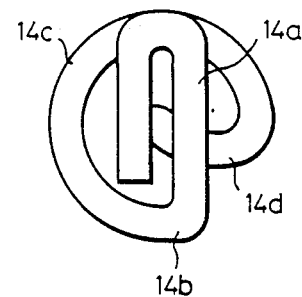

As best illustrated in FIGS. 3A and 3B, the elastic support member 14 is provided with a hooked holding portion 14a, a spirally extending arm portion 14c extending from an end 14b of the holding portion 14a, a curved portion 14d connected at an end thereof to the arm portion 14c and an axial bar portion 14e to be inserted in the hollow tubular portion 24b of the metallic cap 24. The hooked holding portion 14a and the end 14b of the elastic support member 14 tightly hold and accurately position an end of the piezoelectric oscillating element 12. As illustrated in FIG. 3A, the hooked holding portion 14a is inclined at an angle θ (5 through 20 degrees) with respect to a plane perpendicular to the axis of the axial bar portion 14e, to ensure the tight holding of the end of the oscillating element 12, and the end 14b functions as a stop to ensure an axial and accurate positioning of the oscillating element 12. Namely, by the provision of the hooked holding portion 14a and the stop end 14b of the elastic support element 14, the mounting of the piezoelectric oscillating element 14 on the elastic support member 14 is made remarkably easy. The spirally extending arm portion 14c and the curved portion 14d of the elastic support member 14 also absorb longitudinal thermal extension and contraction displacements of the piezoelectric oscillating element 12 and the tubular casing 20, which occur due to a change in an environmental temperature during use of the piezoelectric oscillator. Namely, when a longitudinal thermal displacement of the oscillating element 12 and the tubular casing 20 occurs, the spirally extending arm portion 14c of the support member 14 connected to the fixed bar portion 14e via the curved portion 14d elastically performs axial and torsional movements to compensate for the longitudinal thermal displacement of the oscillating element 12 and the tubular casing 20. It should be noted that, compared with the bending action of the conventional support member, the above-mentioned combination of the axial and torsional movements of the elastic support member 14 are theoretically more effective for absorbing considerable larger thermal displacements of the oscillating element 12 and the casing 20. Namely, even if the size and shape of the support element 14 is relatively small, the spirally extending construction of the elastic support member 14 about the axis of the bar portion 14e of the element 14 per se makes it possible to carry out an absorption of large longitudinal displacements of the oscillating element 12 and the casing 20. The elastic support member 14 can also operate to effectively soften mechanical impulsive and vibratory forces transmitted to the piezoelectric oscillating element 12 from outside the piezoelectric oscillator 10 during the use of the oscillator. Therefore, the electric characteristic of the piezoelectric oscillating element 12 can not be adversely affected by environmental conditions such as a large change of the environmental temperature and externally applied mechanical impacts and vibrations, and as a result, the piezoelectric oscillator 10 becomes a very durable and reliable electric part for use in many kinds of electric and electronic appliances.

Moreover, the elastic support member 14 capable of carrying out the above-mentioned torsional absorbing movement can obviously shorten the axial length of the elastic supporting construction of a piezoelectric oscillator, and therefore, the overall length of the oscillator can be shortened, i.e., a small piezoelectric oscillator can be provided according to the present invention.

FIGS. 3C through 3G respectively illustrate various modified constructions of an elastic support member accommodated in a piezoelectric oscillator according to the present invention.

Figure 3C:
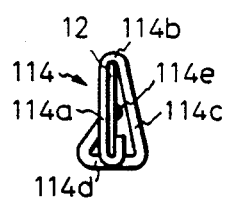
FIGS. 3C through 3G are side views similar to FIG. 3B, illustrating the shapes and constructions of various modifications of the elastic support member used in the embodiment of FIG. 1, respectively.

FIG. 3C illustrates a case where an elastic support member 114 has a hooked holding portion 114a for holding an end of the piezoelectric oscillating element (not shown), an end stop portion 114b for positioning the end of the piezoelectric oscillating element, a linearly extending lever or arm portion 114c, a torsionally displacable portion 114d, and an axial bar portion 114e. The arm and torsionally displacable portions 114c and 114d are able to carry out rotational, axial and torsional movements to absorb the thermal extending and contracting displacements of the piezoelectric oscillating element and the tubular casing when the piezoelectric oscillator is used under a condition wherein an environmental temperature change causes a thermal displacement of the piezoelectric oscillator. In addition, the elastic support member 114 can soften mechanical impulsive and vibratory forces externally transmitted to the oscillating element. Preferably, the end 114b and the connecting point of the arm and torsionally displacable portions are sufficiently spaced apart from one another that the thermal large displacement of the oscillator and the tubular casing is absorbed by the torsional and axial movements of the elastic support element 114.

Figure 3D:
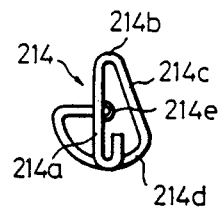

FIG. 3D illustrates another case where an elastic support member 214 has a hooked holding portion 214a for holding an end of the piezoelectric oscillating element (not shown), an end stop portion 214b for positioning the end of the piezoelectric oscillating element, a linearly extending lever or arm portion 214c, a circularly curved and torsionally displacable portion 214d, and an axial bar portion 214e. The operation of the elastic support member 214 is substantially the same as that of the support member 14 or 114, but the circularly curved portion 214d is circularly long, and therefore, the elastically torsional movement of the support element 214 is relatively large.

Figure 3E:
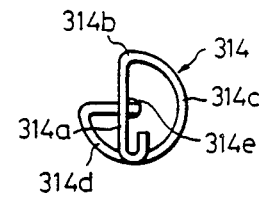

FIG. 3E illustrates a further case where an elastic support member 314 has a hooked holding portion 314a for holding an end of the piezoelectric oscillating element (not shown), an end stop portion 314b for positioning the end of the piezoelectric oscillating element, a circularly extending lever or arm portion 314c, a circularly curved and torsionally displacable portion 314d continuing from the circular arm portion 314c, and an axial bar portion 314e. The operation of the elastic support member 214 is substantially the same as that of the support member 14 or 114, and the circularly extending arm portion 314c and the circularly curved and torsionally displacable portion 314d extend over an angle of approximately 135 degrees.

Figure 3F:
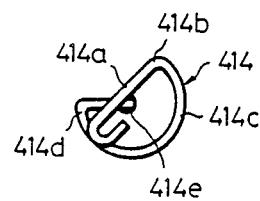

FIG. 3F illustrates another elastic support member 414 which has a hooked holding portion 414a for holding an end of the piezoelectric oscillating element (not shown), an end stop portion 414b for positioning the end of the piezoelectric oscillating element, a circularly extending lever or arm portion 414c, a circularly curved and torsionally displacable portion 414d continuing from the circular arm portion 414c, and an axial bar portion 414e. The construction and operation of this embodiment are substantially the same as those of the member 314 of FIG. 3E, although the hooked holding portion 414a is turned about the axis of the support member 414.

Figure 3G:
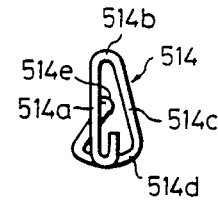

FIG. 3G illustrates another elastic support member 514 which has a hooked holding portion 514a for holding an end of the piezoelectric oscillating element (not shown), an end stop portion 514b for positioning the end of the piezoelectric oscillating element, a linearly extending arm portion 514c, a small circularly curved portion 514d, and an axial bar portion 514e. The construction and operation of the present embodiment are substantially the same as those of the elastic support element 114 of FIG. 3C.

Figure 4:
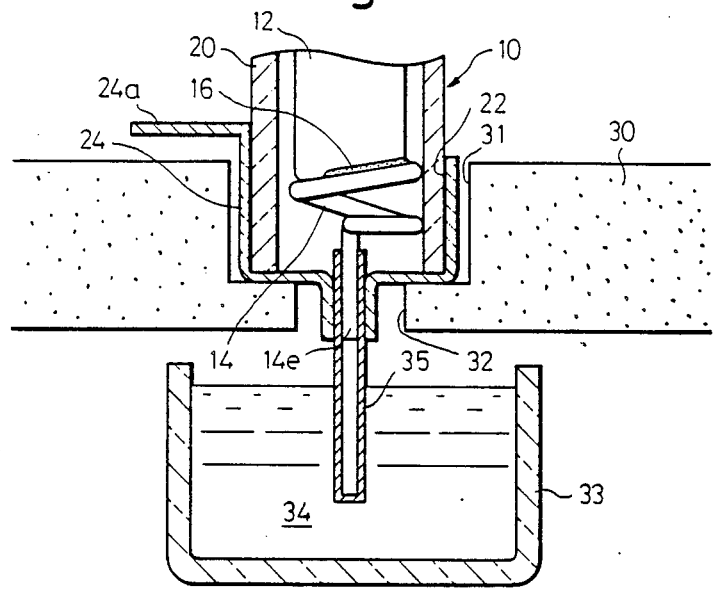
FIG. 4 is a partial vertical cross-sectional view of the oscillator of FIG. 1 and an apparatus for producing the same, illustrating a method of performing a hermetic sealing of one end of the tubular casing of the oscillator.
Figure 5:
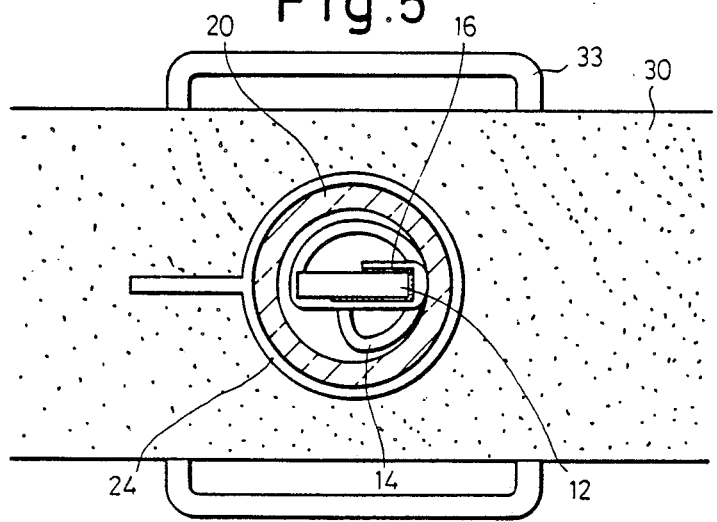
FIG. 5 is a top view taken along the line V—V of FIG. 4.

FIGS. 4 and 5 illustrate a method and apparatus for hermetically attaching the metallic cap 24 to the end of the non-conductive tubular casing 20 of the piezoelectric oscillating element 10 by employing a low melting point glass material, such as glass frit.

In FIGS. 4 and 5, the end of the tubular casing 20 is placed in a fixed conventional carbon heater 30, which is formed with an upper counter bore 31 having a depth and an inner diameter able to seat the end of the tubular casing 20, and a lower small through-bore 32 having a diameter slightly larger than the outer diameter of the tubular portion 24b of the metallic cap 24. Underneath the carbon heater 30 is arranged a container 33 containing therein a liquid coolant, such as a cooling water 34. A heat-sink tube 35 made of a highly heat conductive metallic material, such as copper, aluminum, and silver is positioned in the tubular portion 24b of the metallic cap 24 between the tubular portion 24b and the bar portion 14e of the elastic support member 14.

Before starting the heater 30, a glass paste made by mixing the low melting point glass frit with butylcarbinol acetate is applied to the outer surface of the end of the tubular casing 20. Subsequently, the end of the tubular casing 20 is fitted in the body of the metallic cap 24, and thereafter, the glass paste is naturally dried or dried by heating at approximately 100° C. After drying, the tubular casing 20 with the metallic cap 24 is inserted to the counter bore 31 of the carbon heater 30 so that the outer end of the heat-sink tube 35 placed beforehand in the end of the tubular portion 24b of the metallic cap 24 is immersed in the coolant 34 of the container 33. Then, the carbon heater 30 is energized by supplying an electric current of more than a score of amperes and less than a thousand amperes for a period of time of approximately 30 seconds to one minute, to melt the low melting point glass paste. The molten glass provides an inorganic bonding layer functioning as the sealing glass layer 22 between the tubular casing 20 and the metallic cap 24, when hardened by cooling. At this stage, since the outer end of the heat-sink tube 35 is immersed in the coolant 34, heat transmitted from the carbon heater 30 to the metallic cap 24 is further transmitted to the heat-sink tube 35 and is eventually absorbed by the coolant 34. As a result, damage and deterioration of the electric performance of the piezoelectric oscillating element 12 and the conductive bonding means 16 caused by the heat of the carbon heater 30 are prevented, and thus the inorganic bonding layer 22 can be used to provide a reliable hermetic or airtight sealing between the tubular casing 20 and the cap 24. The heat-sink tube 35 is removed after the metallic cap 24 is assembled on the end of the tubular casing 20.

After the metallic cap 24 is assembled on the end of the tubular casing 20, air is evacuated from the interior chamber 20a of the tubular casing 20 through the tubular portion 24a of the cap 24, a hermetic or airtight sealing is applied at the portion 26, and thus the production of the piezoelectric oscillator 10 is completed.

Figure 6:
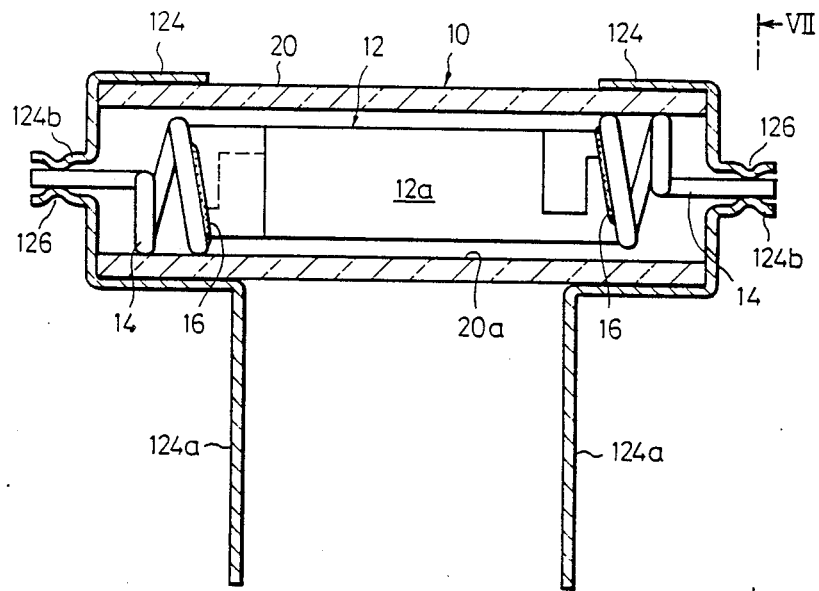
FIG. 6 is a longitudinal cross-sectional view of a tubular piezoelectric oscillator according to a second embodiment of the present invention.
Figure 7:
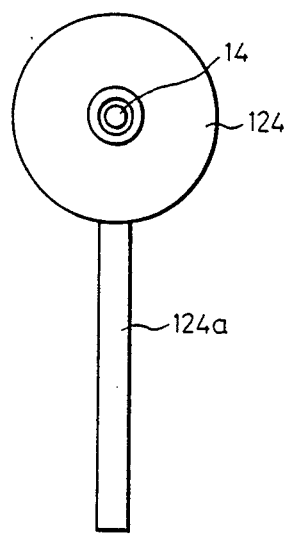
FIG. 7 is a side view of the oscillator taken along the line VII—VII of FIG. 6.

Referring to FIGS. 6 and 7, a piezoelectric oscillator according to a second embodiment of the present invention is shown and generally designated again by a reference numeral 10. The construction of the oscillator 10 of the second embodiment is different from that of the first embodiment of FIGS. 1 and 2 in that a piezoelectric oscillating element 12 coated with a membrane electrode 12a is supported at axially opposite ends thereof by a pair of elastic support members 14 within a vacuum chamber 20a of a non-conductive tubular casing 12. The connection between each of the ends of the oscillating element 12 and the corresponding elastic support member 14 is achieved by the same bonding means 16 as that of the first embodiment. Further, both ends of the tubular casing 20 are airtightly or hermetically closed by a pair of metallic caps 124 which are substantially the same as the cap 24 of the first embodiment. These caps 124 are bonded to the tubular casing 20 by a thin inorganic layer of glass 22 by the same method as described with reference to FIGS. 4 and 5. Also, each metallic cap 124 is provided with a radial projection 124a used as an electric lead, and a tubular sealing portion 124b used for sealing the end of the tubular casing 20 after evacuating air from the interior chamber 20a. Reference 126 generally designates a position at which an airtight sealing is provided for the tubular portion 124b by a mechanical pressure. It should be understood that the end bar portion of the elastic support member 14 is inserted in the tubular portion 124b of the corresponding metallic cap 124. Accordingly, a vacuum condition is established within the chamber 20a of the casing 20, and thus the electric characteristic of the piezoelectric oscillating element 12 can be stably maintained at a high level.

Figure 8:
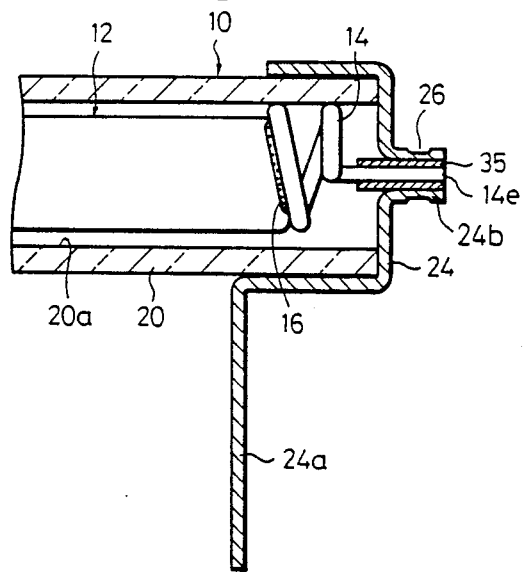
FIG. 8 is a partial longitudinal cross-sectional view of a piezoelectric oscillator according to a third embodiment of the present invention.

FIG. 8 illustrates a piezoelectric oscillator according to a third embodiment of the present invention.

The oscillator 10 of the third embodiment is substantially the same as the oscillator of the first embodiment of FIGS. 1 and 2, except that the heat-sink tube 35 (FIGS. 4 and 5) removed from the end of the metallic cap 24 of the first embodiment is left in the tubular portion 24b of the cap 24 of the third embodiment. Therefore, a mechanical sealing is effected by applying an external pressure at the position 26 so that the tubular portion 24b, the heat-sink tube 35, and the bar portion 14e are tightly combined together. Accordingly, the piezoelectric oscillator of the third embodiment can exhibit a reliable electric performance equal to that of the first embodiment, due to the provision of the elastic support member 14 of the piezoelectric element 12 and a means for establishing a vacuum condition within the hermetically or airtightly sealed tubular casing 20. Further, the oscillator 10 can be easily and reliably mounted on conventional printed circuit boards with and without mounting holes on the surface thereof by a method similar to the mounting of ordinary electric or electronic parts having axial or radial electric leads, such as semiconductor parts, electric resistors, and capacitors. This means that, since the oscillator of the above-described embodiments of the present invention can be commonly used with printed circuit boards having mounting holes and those without mounting holes, if mass production of the oscillator is carried out, the production cost can be remarkably reduced, and stock control of the piezoelectric oscillators becomes easy.

Figure 9:
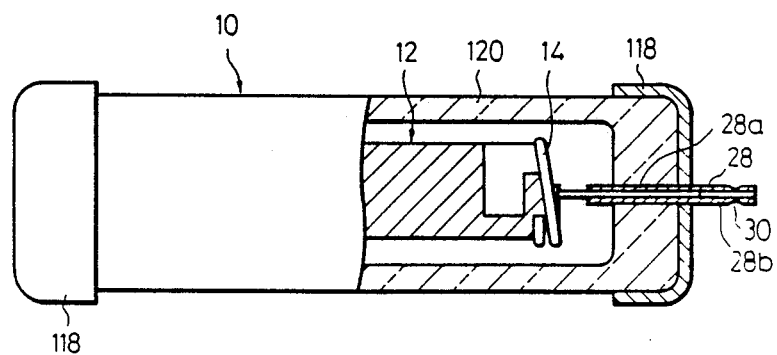
FIG. 9 is a front view, in part cross-section, of a tubular piezoelectric oscillator according to a fourth embodiment of the present invention.

FIG. 9 illustrates a piezoelectric oscillator according to a fourth embodiment of the present invention. The piezoelectric oscillator generally designated at 10 has a closed-end type tubular casing 120 receiving therein a piezoelectric oscillating element 12. The tubular casing 120 is made of the same material as the tubular casing of the first embodiment of FIGS. 1 and 2, i.e., a glass and a ceramic material. Within the tubular casing 120, at least one of the opposite ends of the piezoelectric oscillating element 12 is supported by an elastic and conductive support member 14 similar to that of the first embodiment. That is, the support member 14 is made of an appropriate metallic material having a sufficient elasticity and electric conductivity. The elastic support member 14 has a torsionally movable support portion holding the end of the piezoelectric oscillating element 12 and an outer bar portion inserted in a through-hole of a sealing tube 28. The sealing tube 28 is made of a metallic material having a good sealing property and a linear expansion coefficiency approximately equal to that of the material of the tubular casing 120, such as a kovar, an Ni-Fe system alloy, and copper. An inner end 28a of the sealing tube 28 is inserted to and hermetically sealed in the end of the tubular casing 120, and an outer end 28b of the sealing tube 28 is extended outwardly from the end of the casing 120. Although the outer end 28b of the sealing tube 28 is provided for evacuating air from the interior chamber 120a of the tubular casing 120, it also can be used as an electric lead for extracting an electric oscillating signal from the piezoelectric oscillating element 12. The sealing tube 28 is mechanically pressed so that an airtight sealing is effected at a position designated at 30.

A pair of metallic caps 118 are attached to both ends of the tubular casing 120 by using an appropriate inorganic or organic bonding agent. These metallic caps 118 are electrically connected to the piezoelectric oscillating element 12, and are used as electric leads for extracting an electric oscillating signal from the oscillating element 12.

Figure 10:
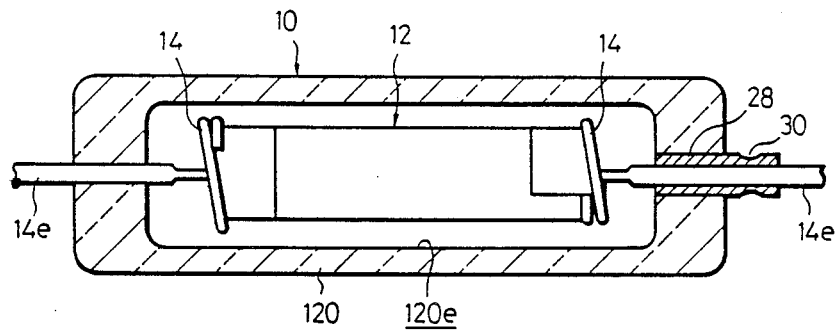
FIG. 10 is a longitudinal cross-sectional view of a tubular piezoelectric oscillator according to a fifth embodiment of the present invention.

FIG. 10 illustrates a piezoelectric oscillator according to a fifth embodiment of the present invention. The piezoelectric oscillator 10 has substantially the same construction as that of the fourth embodiment of FIG. 9 except that the axially opposite ends of the closed-end type tubular casing 120 are not provided with a metallic cap. Further, one of two elastic support members 14 for elastically supporting a piezoelectric oscillating element 12 within a vacuum chamber 120a of the casing 120 is directly fixed and hermetically sealed to an end (left end of FIG. 10) of the tubular casing 120, and the other elastic support member 14 is fixed to the other end (right end of FIG. 10) of the tubular casing 120 via a sealing tube 28 similar to that of the fourth embodiment of FIG. 9. The sealing tube 28 is pressed at a position 30 to maintain the interior chamber 120a of the tubular casing 120 in a vacuum condition. Note, either of the two elastic support members 14 may be replaced with one of those illustrated in FIGS. 3C through 3G. In the fifth embodiment, the outer bar ends 14e of respective elastic support members are arranged to be outwardly linearly extended and are used as electric leads of the oscillator 10. Since the piezoelectric oscillating element 12 is supported by the two torsionally and axially movable elastic support members 14 within the vacuum chamber 120a of the tubular casing 120, the piezoelectric oscillating element 12 can exhibit a stable and reliable electric oscillating characteristic similar to that of the previous first through fourth embodiments.

Figure 11:
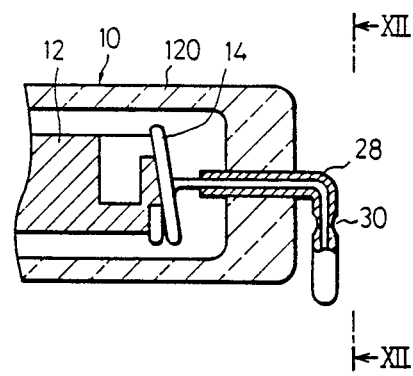
FIG. 11 is a partial cross-sectional view of a tubular piezoelectric oscillator according to a sixth embodiment of the present invention.
Figure 12:
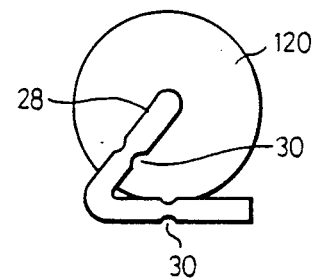
FIG. 12 is a side elevational view of the oscillator of FIG. 11, taken along the line XII—XII of FIG. 11.

FIGS. 11 and 12 illustrate a sixth embodiment of the present invention. A piezoelectric oscillator 10 of FIGS. 11 and 12 is substantially the same as the piezoelectric oscillator 10 of FIG. 9 except that the oscillator 10 of the present sixth embodiment is not provided with a metallic cap, and thus an additional description thereof will not be provided. The sealing tube 28 used as an electric lead is bent at right angle at a position adjacent to the end of the tubular casing 120 as shown in FIG. 11 and then at an acute angle at a separate position distant from the first position, as shown in FIG. 12, so that a horizontal electric lead is formed, and therefore, the piezoelectric oscillator can be easily and firmly fixed on a horizontal mounting surface of a printed circuit board.

As required, another sealing tube 28 may be arranged at the other end of the tubular casing 120. The sealing tube or tubes 28 are mechanically pressed so that an airtight sealing is effected at a position designated at 30. When pressing, the outer end 28b of each sealing tube 28 may be filled beforehand with a soft metal, such as gold (Au), silver (Ag), copper (Cu) and lead (Pb), and thus the sealing effect can be improved. In addition, electric resistance welding or a laser welding may be applied to the position 30 to strengthen the sealing effect.

Figure 13:
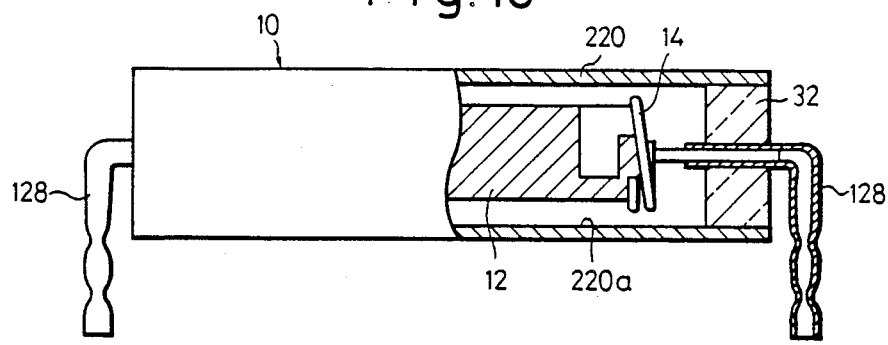
FIG. 13 is a front view, in part cross-section, of a tubular piezoelectric oscillator according to a seventh embodiment of the present invention.

FIG. 13 illustrates a piezoelectric oscillator of a seventh embodiment of the present invention. Referring to FIG. 13, the piezoelectric oscillator generally designated by 10 has an open-ended conductive tubular casing 220 having both ends airtightly or hermetically closed by a glass portion 32 consisting of a low melting point glass material. Alternately, a ceramic tubular casing may be used instead of the metallic tubular casing 220. An interior chamber 220a of the tubular casing 220 is brought to a vacuum condition by using a sealing tube 128 sealingly fixed in the glass portion 32. It should be appreciated that the not cross-sectioned end of the tubular casing 220 of the present embodiment has the same construction as the cross-sectioned end of the casing 220.

A piezoelectric oscillating element 12 made of e.g., a piece of AT cut quartz, is supported at both ends thereof by a pair of elastic support elements 14 substantially similar to those of the first embodiment of FIGS. 1 and 2. In the present embodiment, the tubular casing 220 may be formed with a relatively thin wall thickness, compared with the afore-mentioned glass tubular casing. Therefore, the outer diameter of the oscillator per se can be advantageously reduced.

Figure 14:
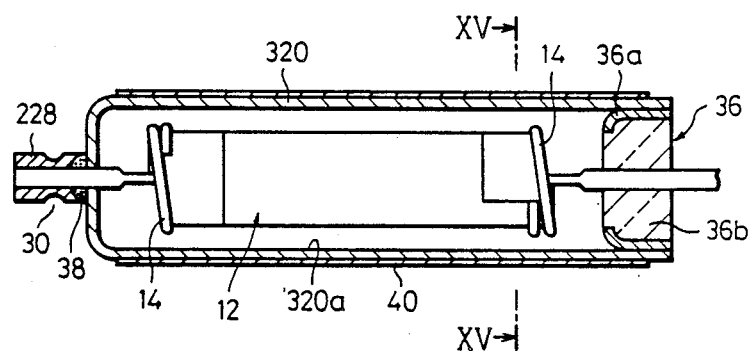
FIG. 14 is a longitudinal cross-sectional view of a tubular piezoelectric oscillator according to a eighth embodiment of the present invention.
Figure 15:
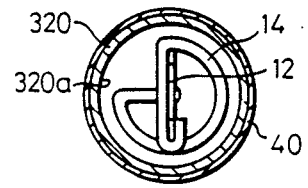
FIG. 15 is a vertical section taken along the line XV—XV of FIG. 14.

FIGS. 14 and 15 illustrate a piezoelectric oscillator according to an eighth embodiment of the present invention. The piezoelectric oscillator 10 includes a metallic tubular casing 320 receiving therein a piezoelectric oscillating element 12 made of an AT cut piece of quartz. The metallic tubular casing 320, which may be formed to have a small diameter as required, has one open end airtightly or hermetically closed by a hermetically sealed terminal member 36, and the other closed end is provided with a small through-hole through which an end of one of the elastic support members 14 passes toward the outside. The outwardly extending end of the elastic support member 14 is fixed to the closed end of the tubular casing by soldering or brazing 38, and a sealing tube 228 is provided for extracting air from the chamber 320a of the tubular casing 320 and mechanically sealing the end of the casing 320 at a pressed position 30. The elastic support members 14 support the piezoelectric oscillating element 12 within a chamber 320a of the metallic tubular casing 320 in a similar manner to that of the previous embodiments. Note: the elastic support members 14 may be replaced with the other support members as described with reference to FIGS. 3C through 3G.

The hermetically sealed terminal member 36 to which one elastic support member 14 is hermetically sealed so as to be operative as an electric lead of the oscillator, is made of a metallic cup-like member 36a filled with a sealing glass 36b. The hermetically sealed terminal member 36 is airtightly attached to the open end of the metallic tubular casing 320.

An electric insulating covering 40 is arranged to cover the outer surface of the metallic tubular casing 320. The covering 40 is made of an appropriate conventional insulating material, such a plastic material.

The piezoelectric oscillator 10 of the present embodiment of FIGS. 14 and 15 can be used as a small, reliable, and inexpensive electric oscillator when accommodated in various electric and electronic appliances.

Figure 16:
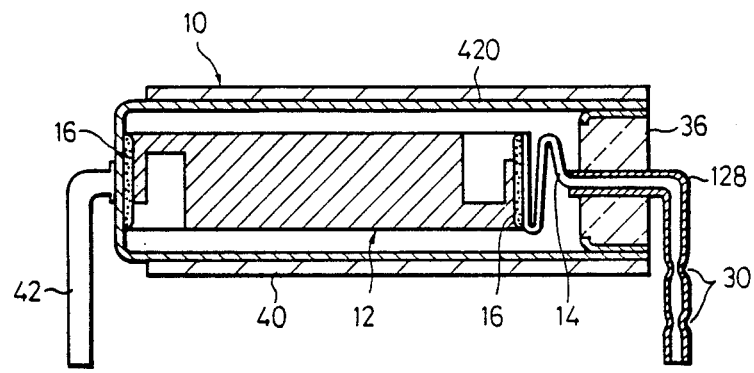
FIG. 16 is a longitudinal cross-sectional view of a tubular piezoelectric oscillator according to a ninth embodiment of the present invention.

FIG. 16 illustrates a piezoelectric oscillator according to a ninth embodiment of the present invention.

The piezoelectric oscillator generally designated by 10 includes a metallic tubular casing 420 having one open end airtightly closed by a hermetically sealed terminal member 36, and an opposite closed end to which an electric lead member 42 made of a conductive solid wire is fixedly attached so as to form an electric lead. Within the tubular casing 420, one end of a piezoelectric oscillating element 12 is mechanically and electrically connected to an inner wall of the closed end of the casing 420 by an appropriate conductive bonding means 16, and the other end of the piezoelectric oscillating element 12 is connected to and elastically supported by an elastic support member 14. A similar conductive bonding means 16 is used to connect the piezoelectric oscillating element 12 to the elastically movable portion of the support member 14, and the bar portion of the elastic support member 14 is inserted in a sealing tube 128 as in the embodiment of FIG. 3. The sealing tube 128 is hermetically fixed to the hermetically sealed terminal member 36. The outer surface of the metallic tubular casing 420 is covered with an electric insulating covering 40 similar to that of the embodiment of FIGS. 14 and 15.

From the foregoing description of the various embodiments, it will be understood that, according to the present invention, a piezoelectric oscillator able to withstand not only thermal stress but also externally applied impulsive and vibratory forces, and capable of exhibiting a stable and reliable electric oscillating characteristic, can be obtained by mass production at a low production cost. Further, the piezoelectric oscillator according to the present invention is easily mounted on a surface of a printed circuit board having or not having mounting holes therein.

Many modifications and variations will occur to a person skilled in the art without departing from the scope and spirits of the present invention defined by the appended claims.

I claim:

1. A piezoelectric oscillator comprising:
   a tubular casing means defining therein an axial vacuum chamber extending between opposite ends thereof;
   a piezoelectric oscillating element received within said axial vacuum chamber of said tubular casing means;
   first and second mutually insulated electrically conductive means arranged at the opposite ends of said tubular casing means for permitting an extraction of an electric oscillating signal from said piezoelectric oscillating element; at least said first conductive means including a first electric lead means;
   a sealing means for hermetically sealing said axial tubular casing means at one end thereof to thereby maintain said chamber of said tubular casing means in a vacuum condition;
   elastic support means for elastically supporting one end of said piezoelectric element within said axial vacuum chamber of said tubular casing to thereby protect said piezoelectric oscillating element from thermal stress and impulsive and vibratory forces; and
   said elastic support means including a conductive and elastically displacable element having a holding portion for positioning and fixedly holding said one end of said piezoelectric element, a rotationally and axially movable arm portion having one end connected to said holding portion and capable of being rotationally and axially moved in response to a thermal axial displacement of said piezoelectric oscillating element, a torsionally displacable portion connected at one end thereof to the other end of said rotationally and axially movable arm portion, and a fixed end bar portion connected to the other end of said torsionally displacable portion, said rotationally and axially movable arm portion and said torsionally displacable portion performing an elastic absorption action to compensate for said axial and thermal displacement of said piezoelectric oscillating element, said fixed bar portion being attached to said hermetic sealing means, and said second conductive means including at least a second electric lead means electrically connected to the other end of said piezoelectric oscillating element, and cooperating with said first electric lead means of said first conductive means to extract said electric oscillating signal.

2. A piezoelectric oscillator according to claim 1, wherein said conductive and elastically displacable element is formed of a heat resistant metallic material.

3. A piezoelectric oscillator according to claim 1, wherein said one end and said other end of said rotationally and axially movable arm portion of said first elastic support means are sufficiently spaced apart from one another within said vacuum chamber of said tubular casing, to thereby permit a large amount of rotational and axial movement of said rotationally and axially movable arm portion.

4. A piezoelectric oscillator according to claim 1, wherein said second conductive means further comprises a second elastic support means for elastically supporting said other end of said piezoelectric oscillating element to thereby cooperate with said first elastic support means to protect said piezoelectric oscillating element from said thermal stress and said impulsive and vibratory forces, said second elastic support means being electrically connected to said second electric lead means.

5. A piezoelectric oscillator according to claim 4, wherein said second conductive means further comprises a second sealing means for hermetically sealing said tubular casing means at said other end thereof, said second sealing means cooperating with said first sealing means of said first conductive means to maintain said chamber of said tubular casing in vacuum condition.

6. A piezoelectric oscillator according to claim 1, wherein said first and second mutually insulated electrically conductive means are airtightly fixed to both ends of said non-conductive tubular casing means by a bonding means.

7. A piezoelectric oscillator according to claim 1, wherein said tubular casing means is made of an electrically conductive material.

8. A piezoelectric oscillator according to claim 1, wherein said tubular casing means is made of a conductive material is coated with a covering made of an electric insulating material.

9. A piezoelectric oscillator comprising:
a non-conductive tubular casing means having a longitudinal axis extending between opposite ends thereof, defining therein a vacuum chamber;
a piezoelectric oscillating element having a longitudinal axis extending between opposite ends thereof received within the vacuum chamber of said non-conductive tubular casing means;
first and second mutually insulated electrically conductive means, having first and second respective electric lead means, mounted at the opposite ends of said non-conductive tubular casing means, for extracting an electric oscillating signal from said piezoelectric oscillating element;
at least one of said first and second conductive means including a metallic cap member having a cap body with a tubular portion extending outwardly from the cap body, fixedly attached to one of said opposite ends of said non-conductive tubular casing means, the cap body being at least one of the first and second electric lead means;
sealing means including the tubular portion of the cap body of the at least one of said first and second conductive means hermetically sealing said tubular casing means at one of the opposite ends thereof for maintaining said chamber of said tubular casing means in a vacuum condition;
elastic support means elastically supporting one of said opposite ends of said piezoelectric element axially within said vacuum chamber of said non-conductive tubular casing for protecting said piezoelectric oscillating element from thermal stress and impulsive and vibratory forces; and
heat absorbing means disposed between said at least one metallic cap member and said elastic support means.

10. A piezoelectric oscillator comprising:
a non-conductive tubular casing means having a longitudinal axis extending between opposite ends thereof, defining therein a vacuum chamber;
a piezoelectric oscillating element having a longitudinal axis extending between opposite ends thereof received within the vacuum chamber of said non-conductive tubular casing means;
first and second mutually insulated electrically conductive means, having first and second electric lead means, mounted at the opposite ends of said non-conductive tubular casing means, for permitting an extraction of an electric oscillating signal from said piezoelectric oscillating element;
said first and second conductive means each including a metallic cap member having a cap body with a tubular portion extending outwardly from the corresponding cap body, fixedly attached to respective opposite ends of said non-conductive tubular casing means, each cap body being a respective first and second electric lead means;
sealing means including the tubular portion of the cap body of each said first and second conductive means hermetically sealing said tubular casing means at the opposite ends thereof for maintaining said chamber of said tubular casing means in a vacuum condition; and
elastic support means elastically supporting said opposite ends of said piezoelectric element axially within said vacuum chamber of said non-conductive tubular casing for protecting said piezoelectric oscillating element from thermal stress and impulsive and vibratory forces.

11. A piezoelectric oscillator according to claim 10, further comprising a heat absorbing means made of a soft metallic material disposed between each said metallic cap member and said electric support means.

* * * * *